(12) United States Patent
Pflum

(10) Patent No.: US 9,166,576 B2
(45) Date of Patent: Oct. 20, 2015

(54) CIRCUITS AND METHODS OF AUTOMATICALLY ADJUSTING A DISCRIMINATOR THRESHOLD

(71) Applicant: Silicon Laboratories Inc., Austin, TX (US)

(72) Inventor: Marty Pflum, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 120 days.

(21) Appl. No.: 14/135,542

(22) Filed: Dec. 19, 2013

(65) Prior Publication Data

US 2015/0180457 A1 Jun. 25, 2015

(51) Int. Cl.
*H03K 5/153* (2006.01)
*H03K 5/125* (2006.01)
*H03K 5/1532* (2006.01)
*H03K 5/24* (2006.01)

(52) U.S. Cl.
CPC .............. *H03K 5/125* (2013.01); *H03K 5/1532* (2013.01); *H03K 5/24* (2013.01)

(58) Field of Classification Search
None
See application file for complete search history.

(56) References Cited

U.S. PATENT DOCUMENTS

| | | | |
|---|---|---|---|
| 4,045,728 A | 8/1977 | Fletcher et al. | |
| 6,549,120 B1 | 4/2003 | de Buda | |
| 7,126,386 B2 * | 10/2006 | Tumer et al. | 327/70 |
| 7,723,979 B2 | 5/2010 | Ashburn | |
| 8,854,240 B2 * | 10/2014 | Chen et al. | 341/118 |
| 2009/0189778 A1 | 7/2009 | Juan et al. | |
| 2010/0302061 A1 | 12/2010 | Winter et al. | |

* cited by examiner

*Primary Examiner* — An Luu
(74) *Attorney, Agent, or Firm* — Cesari & Reed LLP; R. Michael Reed

(57) ABSTRACT

A circuit includes a discriminator to store a threshold. The circuit further includes a comparator including a first input to receive a count, a second input to receive the threshold, and an output to provide an output signal representing a result of the comparison between the count and the threshold. The circuit also includes a controller to automatically adjust the threshold when the count exceeds a first threshold or falls below a second threshold.

20 Claims, 4 Drawing Sheets

CIRCUITS AND METHODS OF AUTOMATICALLY ADJUSTING A DISCRIMINATOR THRESHOLD

FIELD

The present disclosure is generally related to a metering circuit configured to measure a metered resource such as the flow of fluid or gas or to measure energy usage.

BACKGROUND

An electromechanical meter includes a spinning disk that rotates at a rate that is proportional to the flow of gas, water, or electricity through the metering device. In an example, a transducer generates a rotational force in response to the flow rate, and a circuit may be configured to determine the gas, water, or electricity usage based on the rotation of the spinning disk.

SUMMARY

In an embodiment, a circuit includes a discriminator to store a threshold. The circuit further includes a comparator including a first input to receive a count, a second input to receive the threshold, and an output to provide an output signal representing a result of the comparison between the count and the threshold. The circuit also includes a controller to automatically adjust the threshold when the count exceeds a first threshold or falls below a second threshold.

In another embodiment, a method of adjusting a discriminator threshold includes comparing a count of peaks of an oscillating signal to a discriminator value to determine a state of a system. The method further includes automatically adjusting the discriminator value by increasing the discriminator value when the count of the peaks exceeds a first count threshold and by decreasing the discriminator value when the count of the peaks falls below a second count threshold.

In still another embodiment, an apparatus includes a counter to determine a count of peaks of a ringing waveform and includes a comparator having a first input to receive the count, a second input to receive a discriminator threshold, and an output to provide an output signal representing a result of the comparison between the count and the discriminator threshold. The apparatus further includes a controller to automatically adjust the discriminator threshold when the count varies from at least one count threshold.

BRIEF DESCRIPTION OF THE DRAWINGS

In the following discussion, the same reference numbers are used in the various embodiments to indicate the same or similar elements.

DETAILED DESCRIPTION OF ILLUSTRATIVE EMBODIMENTS

A metering system includes a configurable sensing circuit adapted to measure a signal, such as a resonant signal from an inductor/capacitor (LC) tank circuit, a capacitive sense circuit, a Wheatstone bridge circuit (magneto resistive circuit), or other circuitry adapted to produce a measurable signal in response to a parameter to be measured. The metering system includes a metering circuit having a sensor configured to count peaks of an oscillating signal and to determine a state of the system based on the number of peaks. In an example, the metering circuit includes a first comparator to compare the oscillating signal to a threshold to detect the peaks that exceed the threshold and to produce an output representative of such peaks. The metering circuit further includes a counter configured to count the output pulses at the output of the first comparator and to provide a count value as an output. The metering circuit may also include a second comparator having a first input coupled to the output of the counter, a second input coupled to a discriminator to receive a discriminator value or threshold, and an output to provide an output signal representative of the state of the system based on a comparison of the count to the discriminator value.

In an example that includes a rotating wheel and an associated circuit to determine the usage of a utility based on rotation of the wheel, when the count exceeds the discriminator threshold, the state of the system indicates an undamped state; whereas when the count falls below the discriminator threshold, the state of the system indicates a damped state.

Embodiments of a circuit and method are described below that include a controller configured to automatically adjust the discriminator threshold or value in response to the count. In one embodiment, when the count varies from a threshold, the controller automatically adjusts the discriminator threshold by a pre-determined number. In an example, the controller may increment the discriminator threshold by one when the count exceeds a first count threshold and may decrement the discriminator threshold by one when the count falls below a second count threshold. In another embodiment, the controller may increase one or both of a first count threshold and a second count threshold when the count exceeds the first count threshold and may decrease one or both of the first count threshold and the second count threshold when the count falls below the second count threshold. Further, the controller may calculate and apply an adjusted discriminator threshold based on the first and second count thresholds. In an embodiment, the controller may calculate the adjusted discriminator threshold as an average of the first and second count thresholds. One possible example of a metering system that includes a controller configured to automatically adjust the discriminator value is described below with respect to FIG. 1.

Figure 1:
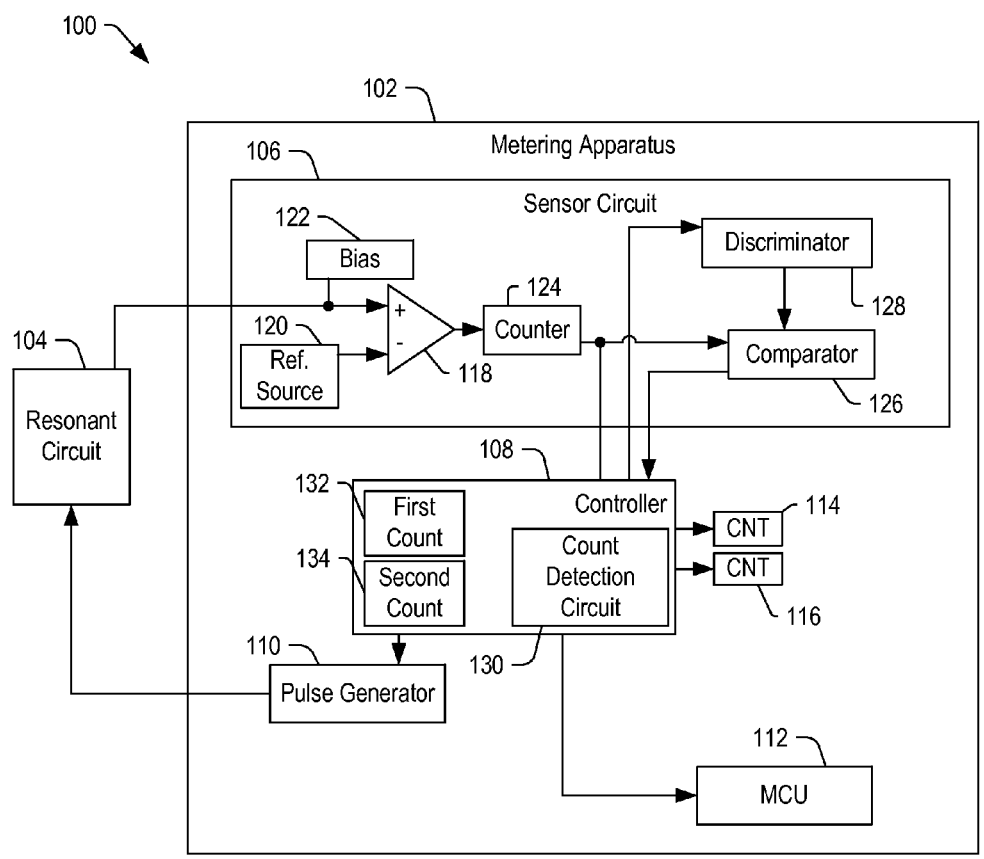
FIG. 1 is a block diagram of a metering system including a circuit to automatically adjust a discriminator threshold according to an embodiment.

FIG. 1 is a block diagram of a metering system 100 including a metering apparatus 102 having a controller 108 to automatically adjust a discriminator threshold according to an embodiment. In the illustrated example, metering system 100 includes metering apparatus 102 coupled to a resonant circuit 104. In another embodiment, resonant circuit 104 may be replaced with a capacitive sense circuit, a Wheatstone bridge circuit (magneto resistive circuit), or other circuitry adapted to produce a measurable signal in response to a parameter to be measured. In an embodiment, resonant circuit 104 may be an inductor-capacitor (LC) tank circuit configured to produce a resonant signal that varies based on a rotational position of a wheel. In an example, the resonant signal may have a first signal characteristic when a non-metallized portion of the wheel is proximate to the LC tank circuit and may have a second (damped) signal characteristic when a metallized portion of the wheel is proximate to the LC tank circuit.

The metering apparatus 102 may include a pulse generator 110 and a sensor circuit 106, which are coupled to the controller 108. The controller 108 may also be coupled to an MCU 112 and to count registers 114 and 116. In an embodiment, the controller 108 may be implemented as processor readable instructions executing on a processor or on the MCU 112. In accordance with another embodiment, the controller 108 may be implemented as a dedicated hardware implementation including, but not limited to, application specific integrated circuits, programmable logic arrays, and other circuit devices.

The sensor circuit 106 includes a comparator 118 having a first input coupled to the resonant circuit 104 to receive an input signal. The first input may also be coupled to a bias source 122 adapted to level shift the input signal. In an embodiment, the bias source 122 may level shift the input signal to a level that is approximately half of rail-to-rail voltage. The comparator 118 further includes a second input coupled to a reference source 120 to receive a reference signal and includes an output coupled to a counter 124. The counter 124 includes an output coupled to a first input of a comparator 126, which has a second input coupled to a discriminator 128 and an output coupled to the controller 108. The comparator 126 is adapted to receive a count from the counter 124 and a discriminator threshold from the discriminator 128 and to produce an output signal corresponding to a result of the comparison.

The controller 108 includes a count detection circuit 130 coupled to the first input of the comparator 118. Further, the controller 108 includes a first count threshold 132 and a second count threshold 134. In an embodiment, the first count threshold 132 may be a maximum count threshold, and the second count threshold 134 may be a minimum count threshold. In another embodiment, the first count threshold 132 may represent highest number of counts of signal peaks, and the second threshold 134 may represent a lowest number of counts of signal peaks. In still another embodiment, the controller 108 may determine the first and second count thresholds 132 and 134 over a number of sampling periods by identifying a set of first counts that correspond to a first state of the system 100 (such as an undamped state) and a second set of counts that correspond to a second state of the system (such as a damped state). The first count threshold 132 may be set equal to an average of the first set of counts, and the second count threshold 134 may be set equal to an average of the second set of counts.

In an embodiment, the controller 108 may cause the pulse generator 110 to provide an excitation signal to the resonant circuit 104. The sensor circuit 106 may receive an input signal in response to the excitation signal. The comparator 118 may compare the input signal to a reference signal from the reference source 120 and may produce an output signal that has a logic high level when the input signal exceeds the reference signal and a logic low level when the input signal falls below the reference signal. The output signal is provided to the counter 124 which counts the pulses and provides a count of the pulses to the comparator 126. The comparator 126 compares the count to a discriminator threshold from the discriminator 128 and produces an output signal representing the state of the system 100. In an embodiment, the output signal of the comparator 126 has a first value when the count indicates an undamped state of the system 100, and has a second value when the count indicates a damped state of the system 100.

The count detection circuit 130 of the controller 108 may monitor the count at the output of the counter 124, and the controller 108 may adjust at least one of the first count threshold 132 and the second count threshold 134 in response to the count. In an embodiment, the controller 108 may adjust the first count threshold 132 and/or the second count threshold 134 by a pre-determined number. In an embodiment, the controller 108 may increment both the first count threshold 132 and the second count threshold 134 when the count exceeds the first count threshold, and may decrement both the first count threshold 132 and the second count threshold 134 when the count falls below the second count threshold. In another embodiment, the controller 108 may increment the first count threshold 132 when the count exceeds the first count threshold and may decrement the second count threshold 134 when the count falls below the second count threshold. In an embodiment, the amount by which the first count threshold 132 and/or the second count threshold 134 is adjusted may be determined by a difference between the count and the corresponding threshold. For example, if the count exceeds the first count threshold 132 by two, the controller 108 may increment the first count threshold 132 by two. When one or both of the first count threshold 132 and the second count threshold 134 are adjusted, the controller 108 may automatically determine an adjusted discriminator threshold and may communicate the adjusted discriminator threshold to the discriminator 128 for subsequent comparison operations.

In an embodiment, the controller 108 may automatically adjust the discriminator threshold based on any changes in the dampened or undampened peak counts of the input signal. In an example, if the resonant circuit 104 is an inductor-capacitor (LC) tank circuit that produces a number of detectable ringing peaks for the undampened condition and a different number of detectable ringing peaks for the dampened condition. In one possible example, the LC tank circuit produces 30 peaks for the undampened condition (undampened state) and produces 25 peaks for the dampened condition (dampened state). During an initialization mode of operation (which may correspond to a period of time after power up), after each sample, the controller 108 may update the first count threshold 132 and the second count threshold 134. In an embodiment, if the new sample is less than the second count threshold 134, the second count threshold 134 may be updated to match the new count sample. Once a number of samples have been taken such that a representative first count value (e.g., a maximum value) and a representative second count value (e.g., a minimum value) have been determined, the controller 108 may switch to an automated tracking mode.

In the automated tracking mode, the controller 108 assumes that the first count threshold 132 and the second count threshold 134 may be roughly the same distance apart from sample to sample. In the example values provided above, the first count threshold 132 and the second count threshold 134 may be approximately 5 counts apart. As the temperature varies or the device behavior changes over time, the controller 108 may adjust both the first count threshold 132 and the second count threshold 134 by the same distance (i.e., by the same number). In one embodiment, the controller 108 adjusts the first count threshold 132 and the second count threshold 134 by a pre-defined increment, such as a distance of +1 or −1. If the new sample is greater than the first count threshold 132, both the controller 108 may increment the first count threshold 132 and the second count threshold 134 by one. If the new sample is less than the second count threshold 134, the controller 108 may decrement the first count threshold 132 and the second count threshold 134 by one. In such an embodiment, the incremental adjustments to the first count threshold 132 and the second count threshold 134 may prevent a large change in the case of a bad sample.

In an embodiment, the comparator 126 compares the count from counter 124 to the discriminator threshold from discriminator 128 to decide if the sample represents a dampened state or an undampened state. Once the controller 108 enters the automated tracking mode, the controller 108 may control the discriminator 128 to center the discriminator threshold at a value that is between the first count threshold 132 and the second count threshold 134 (e.g., at an average value of the first count threshold 132 and the second count threshold 134). In an embodiment, the average value may be rounded up to a nearest integer value. For example, if the first count threshold 132 is 30 and the second count threshold 134 is 25, the controller 108 may adjust the discriminator threshold of the discriminator 128 to be centered at 28 (i.e., (30−25)/2=27.5, which rounds up to 28). Over time, the controller 108 may detect new counts that may gradually reduce the second count threshold 134 to a value of 22. In this embodiment, the controller 108 may be configured to adjust both the first count threshold 132 and the second count threshold 134, and the change in the second count threshold 134 (i.e., 22) would be tracked by the first count threshold 132 (i.e., 27). In response to the changes, the controller 108 would adjust the discriminator threshold to be centered between the first count threshold 132 and the second count threshold 134 at a value of approximately 25. It should be understood that the values provided above are illustrative only, and that other counts, other count thresholds, and other discriminator thresholds are possible.

While the illustrated example of FIG. 1 depicts a single resonant circuit 104, other types of circuits may be used, including a capacitive sense circuit, a Wheatstone bridge circuit, or other circuitry adapted to produce a measurable signal in response to a parameter to be measured. Additionally, in some embodiments, a second resonant circuit may be coupled to a second sensing circuit within the metering apparatus 102. In an embodiment of the metering apparatus 102 that is configured to monitor rotation of a wheel, sensing circuits (such as first and second resonant circuits) may be positioned adjacent to the wheel and spaced apart from one another to provide dual measurement signals, which can be processed to determine the rate of rotation as well as the direction. In this example, as a metallized portion of the wheel is proximate to one of the resonant circuits, the input signal to the sensing circuit 106 may be dampened. In contrast, when a non-metallized portion of the wheel is proximate to one of the resonant circuits, the input signal to the sensing circuit 106 may be undampened. One possible example of a metering system including a metering circuit that can receive two different resonant signals is described below with respect to FIG. 2.

Figure 2:
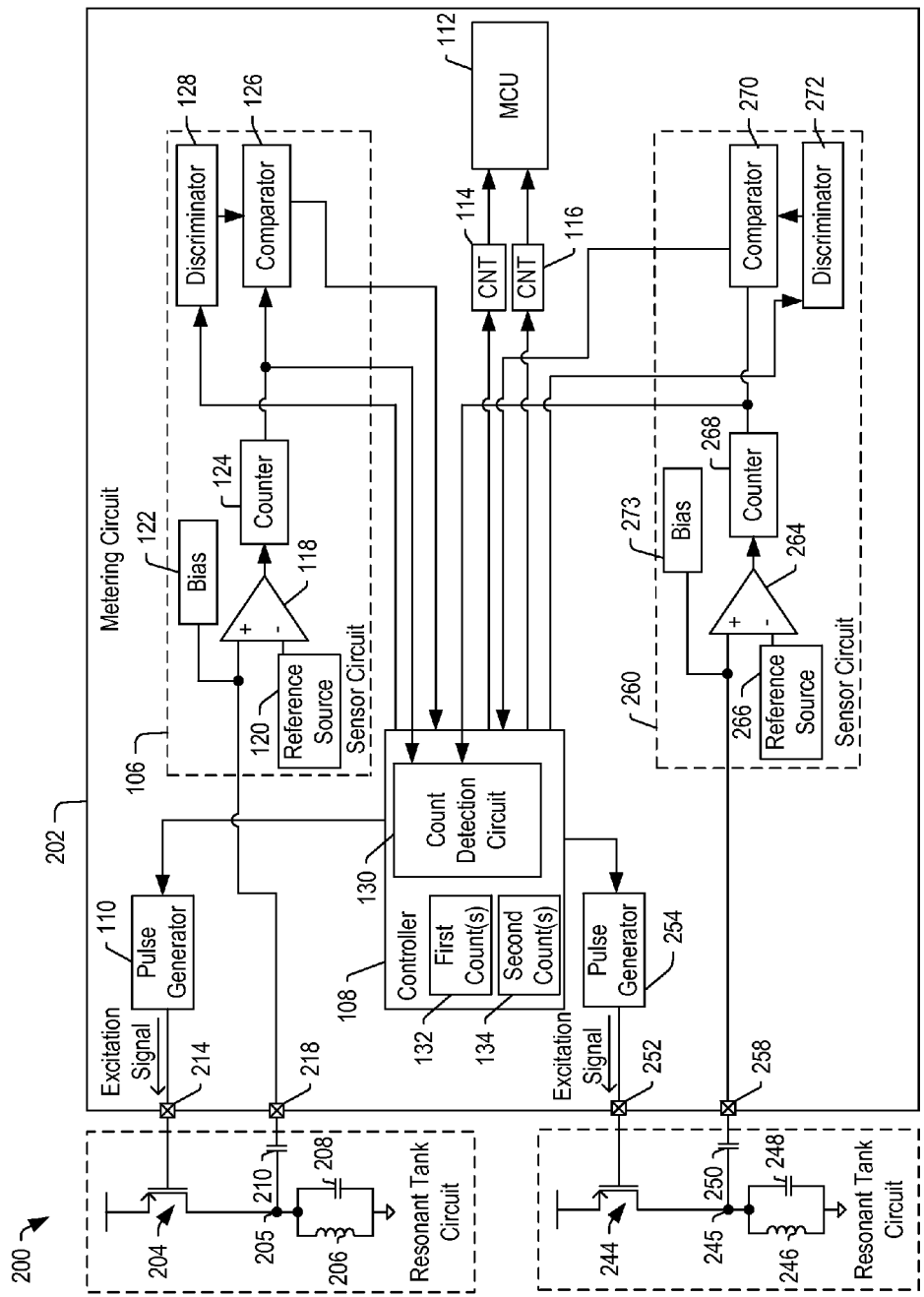
FIG. 2 is a block diagram of a metering system including a circuit to automatically adjust a discriminator threshold according to a second embodiment.

FIG. 2 is a block diagram of a metering system 200 including a circuit 202 to automatically adjust a discriminator threshold according to a second embodiment. Metering circuit 202 is configured to receive a signal from two external circuits, which in this embodiment included resonant tank circuits. In the illustrated example, metering circuit 202 includes all of the elements of metering apparatus 102 of FIG. 1, including sensor circuit 106, controller 108, pulse generator 110, MCU 112, and count registers 114 and 116. Further, the metering circuit 202 includes additional circuitry to facilitate operation with two input signal sources, such as resonant tank circuits.

The metering circuit 202 includes the pulse generator 110 coupled between the controller 108 and an output 214, which may be implemented as a pad, pin or contact location configurable to interconnect with an external circuit. The metering circuit 202 further includes an input 218, which may be implemented as a pad, pin, or contact location configurable to interconnect with an external circuit. The input 218 may be coupled to the sensor circuit 106.

The sensor circuit 106 includes the comparator 118 having a first input coupled to input 218 and to the bias source 122, a second input coupled to the reference source 120, and an output coupled to the counter 124. The counter 124 includes an output coupled to a first input of the comparator 126, which includes a second input coupled to the discriminator 128 and includes an output.

The metering circuit 202 further includes a pulse generator 254 coupled between the controller 108 and an output 252, which may be implemented as a pad, pin or contact location configurable to interconnect with an external circuit. The metering circuit 202 further includes an input 258, which may be implemented as a pad, pin, or contact location configurable to interconnect with an external circuit. The input 218 is coupled to a sensor circuit 260.

The sensor circuit 260 includes a comparator 264 having a first input coupled to the input 258 and to a bias source 273, a second input coupled to a reference source 266, and an output coupled to a counter 268. In an example, the bias source 273 may include a voltage configured to level shift the input signal. Further, reference source 266 may be the same as the reference source 120, depending on the implementation. The counter 268 includes an output coupled to a first input of a comparator 270, which includes a second input coupled to a discriminator 272. The comparator 270 further includes an output.

The metering circuit 202 includes the controller 108, which may be implemented as a finite state machine. The controller 108 includes outputs coupled to pulse generators 110 and 254. Further, the controller 108 includes an input coupled to the output of comparator 126 and an input coupled to the output of comparator 270. The controller 108 also includes an output coupled to count register 114 and an output coupled to count register 116. Additionally, the controller 108 includes outputs coupled to discriminators 128 and 272. The metering circuit 202 further includes a microcontroller unit (MCU) 112 coupled to count registers 114 and 116. MCU 112 may include a plurality of connections (not shown) to communicate with other circuitry of metering circuit 202 (such as transceivers, memory, and other circuits).

The external resonant tank circuits may be configured to generate a resonant signal that has damping characteristics that vary based on a parameter to be sensed. In the illustrated example, the resonant circuits are LC tank circuits including a first resonant tank circuit that includes a transistor 204 coupled between a power supply and a node 205, and including a gate coupled to output 214 of metering circuit 202. The first resonant tank circuit further includes an inductor 206 and a capacitor 208 coupled in parallel between node 205 and a second power supply, such as ground. Additionally, the first resonant tank circuit is AC coupled to input 218 through capacitor 210, which is coupled between node 205 and input 218.

The resonant tank circuits further include a second resonant tank circuit having a transistor 244 coupled between a power supply and a node 245, and including a gate coupled to output 252 of metering circuit 202. The second resonant tank circuit further includes an inductor 246 and a capacitor 248 coupled in parallel between node 245 and a second power supply, such as ground. Additionally, the second resonant tank circuit is AC coupled to input 258 through capacitor 250, which is coupled between node 245 and input 258.

In an embodiment, the controller 108 sends a signal to pulse generator 110, causing pulse generator 110 to apply an excitation signal or pulse to output 214. The excitation signal biases transistor 204 to briefly couple the power supply to node 205, charging capacitor 208. When the excitation signal is stopped (i.e., the pulse ends), transistor 204 decouples the power supply from node 205. Charge stored by capacitor 208 is discharged into inductor 206, building up a magnetic field around the inductor 206 and reducing the voltage stored by the capacitor 208. When the capacitor 208 is discharged, the inductor 206 will have the charge stored in its magnetic field and since the inductor 206 resists changes in current flow, the energy to keep the current flowing is extracted from the magnetic field, which begins to decline, and the current flow will charge the capacitor 208 with a voltage of opposite polarity to its original charge. When the magnetic field of inductor 206 is dissipated, the current stops and the opposite polarity charge is stored in capacitor 208. The discharge/recharge process is repeated with the current flowing in the opposite direction through the inductor 206. The energy oscillates back and forth between the capacitor 208 and the inductor 206 until (if not replenished by power from an external circuit, such as the power supply through transistor 204) internal resistance makes the oscillations die out. When used in conjunction with a metering wheel that has a metallized portion, the oscillations die out faster (damped) when the metallized portion is proximate to the resonant tank circuit and die out slower (undamped) when the non-metallized portion is proximate to the resonant tank circuit.

The comparators 126 and 270 compare the counts from counters 124 and 268, respectively, to discriminator thresholds from discriminators 128 and 272, respectively. The comparator 126 produces an output indicating a state (damped or undamped) of the system 200 as determined from the input signal received at input 218. Similarly, the comparator 270 produces an output signal indicating a state (damped or undampened) of the system 200 as determined from the input signal received In an embodiment, the controller 108 uses the count detection circuit 130 to monitor the pulse counts from counters 124 and 268. The controller 108 may store a first count threshold 132 for each counter 124 and 268 and a second count threshold 134 for each counter 124 and 268 or may store a single value to be shared by both sensor circuits 106 and 260, depending on the implementation.

In an example that assumes that separate count thresholds are stored for each counter 124 and 268, the controller 108 may compare a first count received from counter 124 to a range defined by the first count threshold 132 and the second count threshold 134 (which count thresholds are associated with the counter 124), and may adjust one or both of the first count threshold 132 and the second count threshold 134 if the count is outside of the range. Further, the controller 108 may compare a first count received from counter 268 to a range defined by a first count threshold 132 and a second count threshold 134 (which count thresholds are associated with the counter 268), and may adjust one or both of the first count threshold 132 and the second count threshold 134 if the count is outside of the range.

The controller 108 may adjust the discriminator threshold of discriminator 128 based on the first count threshold 132 and the second count threshold 134 associated with the counter 124. Further, the controller 108 may adjust the discriminator threshold of discriminator 272 based on the first count threshold 132 and the second count threshold 134 associated with the counter 268. It should be appreciated that the controller 108 may adjust the discriminator threshold of discriminator 128 independently from the discriminator threshold of discriminator 272. In an example, the amount by which the discriminator threshold of discriminator 128 is adjusted is greater than that by which the discriminator threshold of discriminator 272 is adjusted, or vice versa. In another example, the controller 108 may increment the discriminator threshold of discriminator 272 and may decrement the discriminator threshold of discriminator 128, or vice versa. In another example, the controller 108 may adjust the discriminator threshold of discriminator 128 and may not adjust the discriminator threshold of discriminator 272.

In an example, the controller 108 may control the discriminator 128 to center the discriminator threshold at a value that is between the first count threshold 132 and the second count threshold 134 of the counter 124 (e.g., at an average value of the first count threshold 132 and the second count threshold 134). The controller 108 may independently control the discriminator 272 to center the discriminator threshold at a value that is between the first count threshold 132 and the second count threshold 134 of the counter 168 (e.g., at an average value of the first count threshold 132 and the second count threshold 134). In an embodiment, the average values may be rounded up to a nearest integer value.

Figure 3:
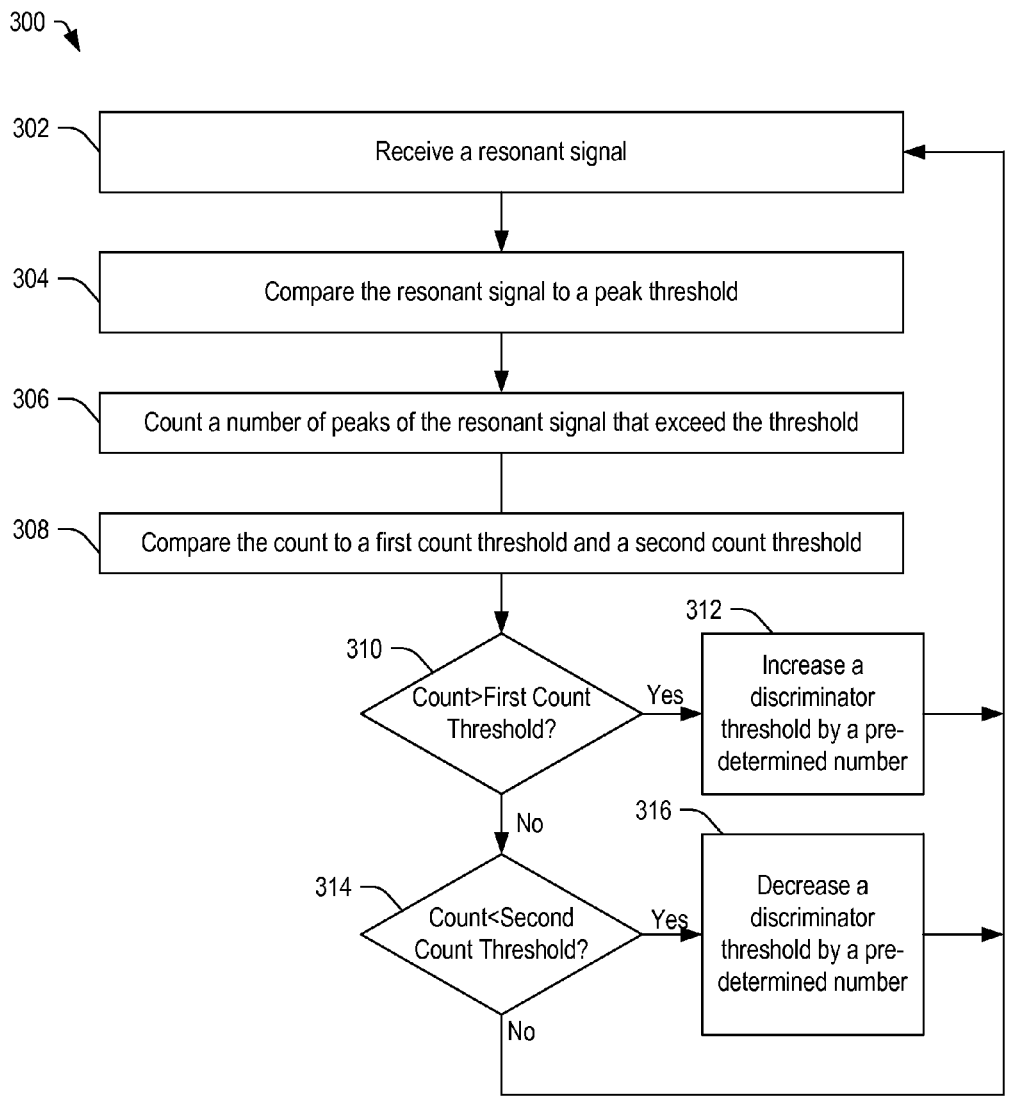
FIG. 3 is a flow diagram of a method of automatically adjusting a discriminator threshold.

FIG. 3 is a flow diagram of a method 300 of automatically adjusting a discriminator threshold. At 302, a resonant signal is received. The resonant signal may be received at an input of a metering circuit. Advancing to 304, the resonant signal is compared to a peak threshold. In an example, the peak threshold may be selected at a level that provides separation (i.e., a difference in peak counts) when the circuit is in a first condition or first state as compared to when the circuit is in a second condition or second state.

Continuing to 306, a counter counts a number of peaks of the resonant signal that exceed the threshold. Moving to 308, a comparator compares the count to a first count threshold and a second count threshold. Proceeding to 310, if the count exceeds the first count threshold, the method 300 continues to 312 and the controller increases a discriminator threshold by a predetermined amount. In an embodiment, the controller may be configured to increment the discriminator threshold by one or by another amount. In an alternative embodiment, the controller may adjust the first count threshold and the second count threshold by an amount, and increase the discriminator threshold by a calculated amount based on the first count threshold and the second count threshold, such as by averaging them. The method 300 then returns to 302 to receive another resonant signal.

Returning to 310, if the count is less than the first count threshold, the method 300 proceeds to 314. If the count is less than a second count threshold, the method 300 moves to 316 and the controller decreases the discriminator threshold by a predetermined amount. As discussed above, the controller may be configured to decrease the discriminator threshold by one or by another amount. In an alternative embodiment, the controller may decrease the first count threshold and the second count threshold by an amount, and decrease the discriminator threshold by a calculated amount based on the first count threshold and the second count threshold, such as by averaging them. Otherwise, at 314, if the count is greater than the second count threshold, the method 300 returns to 302 to receive a next resonant signal.

In an embodiment, the circuit may compare a count of peaks of an oscillating signal to the discriminator value to determine a state of a system, such as a damped state and an undamped state. The circuit may automatically adjust the discriminator value when the count varies from one of a first count threshold and a second count threshold. In an embodiment, the first count threshold corresponds to the count of the peaks of the oscillating signal when a system is in an undamped state and the second count threshold corresponds to the count of the peaks of the oscillating signal when the system is in a damped state.

In an embodiment, prior to automatically adjusting the discriminator value, the method may include capturing the count of peaks of the oscillating signal over a plurality of sampling periods, identifying a first set of counts corresponding to a first state of a system, determining a first average of the first set of counts, and setting the first count threshold equal to the first average. Further, in an embodiment, the method may also include identifying a second set of counts corresponding to a second state of the system, determining a second average of the second set of counts, and setting the second count threshold equal to the second average.

Figure 4:
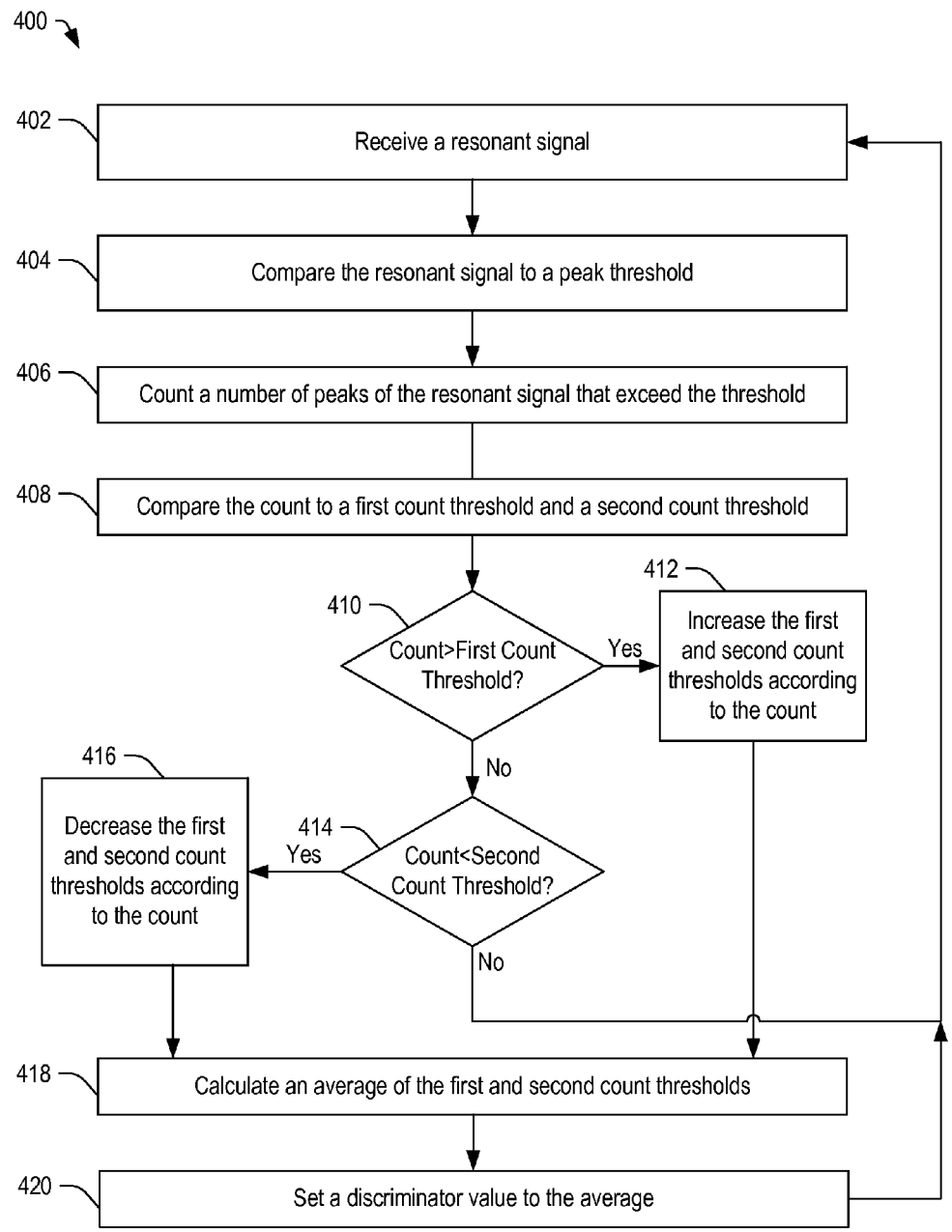
FIG. 4 is a flow diagram of a method of automatically adjusting a discriminator threshold according to a second embodiment.

FIG. 4 is a flow diagram of a method 400 of automatically adjusting a discriminator threshold according to a second embodiment. At 402, a metering circuit receives a resonant signal. Advancing to 404, the resonant signal is compared to a peak threshold. In an example, the metering circuit includes a comparator configured to compare the resonant signal to a peak threshold.

Continuing to 406, the metering circuit counts the number of peaks of the resonant signal that exceed the threshold. In an embodiment, the metering circuit includes a counter configured to count the number of peaks and to produce an output signal corresponding to the count. Proceeding to 408, the metering circuit compares the count to a first count threshold and a second count threshold. In an embodiment, the metering circuit includes a controller configured to compare the first count threshold and the second count threshold.

Moving to 410, if the count exceeds the first count threshold, the method 400 continues to 412 and the controller increases the first and second count thresholds according to the count. In an embodiment, the controller may increase the first and second count thresholds by a predetermined amount. The method 400 then continues to 418 and the controller calculates an average of the first and second count thresholds. Continuing to 420, the controller sets a discriminator value to the average of the first and second count thresholds. The method 400 then returns to 402 to receive the resonant signal.

Returning to 410, if the count is less than the first count threshold, the method 400 continues to 414. If the count is less than the second count threshold, the method 400 continues to 416 and the controller decreases the first and second count thresholds according to the count. In an embodiment, the controller may decrease the first and second count thresholds by a predetermined amount. The method 400 then continues to 418 and the controller calculates an average of the first and second count thresholds. Continuing to 420, the controller sets a discriminator value to the average of the first and second count thresholds. The method 400 then returns to 402 to receive the resonant signal.

Returning to 414, if the count is greater than the second count threshold, the method 400 returns to 402 to receive another resonant signal.

In accordance with various embodiments, the controller 108 and the methods described herein may be implemented as processor readable instructions executing on a processor or on the MCU 112. In accordance with another embodiment, the controller 108 and the methods described herein may be implemented as a dedicated hardware implementation including, but not limited to, application specific integrated circuits, programmable logic arrays, and other hardware devices can likewise be constructed to implement the methods described herein.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive. Workers skilled in the art will recognize that changes may be made in form and detail without departing from the scope of the disclosure.

What is claimed is:

1. A circuit comprises:
   a discriminator to store a discriminator threshold;
   a comparator circuit including a first input to receive a count, a second input to receive the discriminator threshold, and an output to provide an output signal representing a result of the comparison between the count and the discriminator threshold; and
   a controller to automatically adjust the discriminator threshold when the count exceeds a first threshold or falls below a second threshold.

2. The circuit of claim 1, wherein the controller automatically increases the discriminator threshold by a pre-determined number when the count exceeds the first threshold.

3. The circuit of claim 1, wherein the controller automatically decreases the discriminator threshold by a pre-determined number when the count falls below the second threshold.

4. The circuit of claim 1, wherein the controller:
   automatically increases the first threshold and the second threshold when the count exceeds the first threshold; and
   automatically decreases the first threshold and the second threshold when the count falls below the second threshold.

5. The circuit of claim 4, wherein the controller automatically adjusts the discriminator threshold to an average of the first threshold and the second threshold.

6. The circuit of claim 1, wherein the first threshold corresponds to the count when a system is in an undamped state and the second threshold corresponds to the count when the system is in a damped state.

7. A method of adjusting a discriminator threshold, the method comprising:
   comparing a count of peaks of an oscillating signal to a discriminator value to determine a state of a system; and
   automatically adjusting the discriminator value by increasing the discriminator value when the count of the peaks exceeds a first count threshold and by decreasing the discriminator value when the count of the peaks falls below a second count threshold.

8. The method of claim 7, wherein:
   the first count threshold corresponds to the count of the peaks of the oscillating signal when a system is in an undamped state; and the second count threshold corresponds to the count of the peaks of the oscillating signal when the system is in a damped state.

9. The method of claim 7, wherein automatically adjusting the discriminator value comprises increasing the discriminator value by a pre-determined number when the count exceeds the first count threshold.

10. The method of claim 7, wherein automatically adjusting the discriminator value comprises decreasing the discriminator value by a pre-determined number when the count falls below the second count threshold.

11. The method of claim 7, wherein automatically adjusting the discriminator value comprises updating at least one of the first count threshold and the second count threshold in response to the count.

12. The method of claim 11, further comprising automatically adjusting the discriminator threshold to an average of the first count threshold and the second count threshold.

13. The method of claim 7, wherein prior to automatically adjusting the discriminator value, the method further comprises:
    capturing the count of peaks of the oscillating signal over a plurality of sampling periods;
    identifying a first set of counts corresponding to a first state of a system;
    determining a first average of the first set of counts; and
    setting the first count threshold equal to the first average.

14. The method of claim 13, further comprising:
    identifying a second set of counts corresponding to a second state of the system;
    determining an second average of the second set of counts; and
    setting the second count threshold equal to the second average.

15. The method of claim 7, wherein prior to automatically adjusting the discriminator value, the method further comprises:
    capturing a new count of peaks that is greater than the first count threshold; and
    setting the first count threshold equal to the new count.

16. The method of claim 7, wherein prior to automatically adjusting the discriminator value, the method further comprises:
    capturing a new count of peaks that is less than the second count threshold; and
    setting the second count threshold equal to the new count.

17. An apparatus comprising:
    a counter to determine a count of peaks of a ringing waveform;
    a comparator including a first input to receive the count, a second input to receive a discriminator threshold, and an output to provide an output signal representing a result of the comparison between the count and the discriminator threshold; and
    a controller to automatically adjust the discriminator threshold when the count varies from at least one count threshold.

18. The apparatus of claim 17, wherein the at least one count threshold comprises:
    a first count threshold corresponding to an undamped state of the apparatus; and
    a second count threshold corresponding to the damped state of the apparatus.

19. The apparatus of claim 17, wherein the controller:
    increases the first count threshold and the second count threshold when the count exceeds the first count threshold; and
    decreases the first count threshold and the second count threshold when the count falls below the second count threshold.

20. The apparatus of claim 17, wherein the controller adjusts the discriminator threshold to a level that is between the first count threshold and the second count threshold.

* * * * *